United States Patent [19]
Tu

[11] Patent Number: 5,796,641
[45] Date of Patent: Aug. 18, 1998

[54] SYSTEM AND TABLE-BASED METHOD FOR CONVERTING BINARY FLOATING-POINT NUMBERS TO A DECIMAL REPRESENTATION

[75] Inventor: Nengkuan Tu, Austin, Tex.

[73] Assignee: International Business Machines Corporation, Armonk, N.Y.

[21] Appl. No.: 650,204

[22] Filed: May 20, 1996

[51] Int. Cl.⁶ .............................. G06F 7/00; G06F 15/00
[52] U.S. Cl. .................................. 364/715.03; 341/104
[58] Field of Search ................... 364/715.03, 748; 340/347, 172.5; 341/57, 62, 84, 85, 105, 104

[56] References Cited

U.S. PATENT DOCUMENTS 4,719,450  1/1988  Yamauchi ........................... 340/347
5,161,117  11/1992  Waggener, Jr. .................... 364/715.03

Primary Examiner—Paul P. Gordon
Assistant Examiner—Monica Lewis
Attorney, Agent, or Firm—Richard A. Henkler; Andrew J. Dillon

[57] ABSTRACT

An improved system for converting a binary floating-point number to a decimal representation within a table-based computer is disclosed. In accordance with a preferred embodiment of the present invention, a computer system is provided which includes a first table and a second table. Both of the tables have several entry locations, and each of these entry locations contains a number. The computer system also has an extraction routine for extracting a first index into the first table from a binary floating-point number, an acquiring routine for obtaining a second index into the second table from the number contained within an entry location of the first table referenced by the first index, and an identifying routine for identifying a selected entry location of the second table. Such identification can be performed either by utilizing the second index or by utilizing a decremented second index when a number contained within an initial entry location of the second table referenced by the second index is greater than the binary floating-point number. In addition, the computer system also includes a display for displaying a most significant digit of a number contained within the selected entry location of the second table. Finally, the computer system includes a subtraction routine for subtracting the number contained within the selected entry location of the second table from the binary floating-point number, and a detection routine for detecting whether the binary floating-point number is equal to zero.

12 Claims, 5 Drawing Sheets

Fig. 4

```
 1   /* 0x3ff0000000000000 */
 1   /* 0x3ff2000000000000 */
 1   /* 0x3ff4000000000000 */
 1   /* 0x3ff6000000000000 */
 1   /* 0x3ff8000000000000 */
 1   /* 0x3ffa000000000000 */
 1   /* 0x3ffc000000000000 */
 1   /* 0x3ffe000000000000 */
 2   /* 0x4000000000000000 */
 2   /* 0x4002000000000000 */
 2   /* 0x4004000000000000 */
 2   /* 0x4006000000000000 */
 3   /* 0x4008000000000000 */
 3   /* 0x400a000000000000 */
 3   /* 0x400c000000000000 */
 3   /* 0x400e000000000000 */
 4   /* 0x4010000000000000 */
 4   /* 0x4012000000000000 */
 5   /* 0x4014000000000000 */
 5   /* 0x4016000000000000 */
 6   /* 0x4018000000000000 */
 6   /* 0x401a000000000000 */
 7   /* 0x401c000000000000 */
 7   /* 0x401e000000000000 */
 8   /* 0x4020000000000000 */
 9   /* 0x4022000000000000 */
10   /* 0x4024000000000000 */
10   /* 0x4026000000000000 */
10   /* 0x4028000000000000 */
10   /* 0x402a000000000000 */
10   /* 0x402c000000000000 */
10   /* 0x402e000000000000 */
10   /* 0x4030000000000000 */
10   /* 0x4032000000000000 */
11   /* 0x4034000000000000 */
11   /* 0x4036000000000000 */
11   /* 0x4038000000000000 */
11   /* 0x403a000000000000 */
11   /* 0x403c000000000000 */
12   /* 0x403e000000000000 */
12   /* 0x4040000000000000 */
12   /* 0x4042000000000000 */
13   /* 0x4044000000000000 */
13   /* 0x4046000000000000 */
13   /* 0x4048000000000000 */
14   /* 0x404a000000000000 */
14   /* 0x404c000000000000 */
15   /* 0x404e000000000000 */
15   /* 0x4050000000000000 */
16   /* 0x4052000000000000 */
17   /* 0x4054000000000000 */
17   /* 0x4056000000000000 */
17   /* 0x4058000000000000 */
18   /* 0x405a000000000000 */
19   /* 0x405c000000000000 */
19   /* 0x405e000000000000 */
19   /* 0x4060000000000000 */
19   /* 0x4062000000000000 */
19   /* 0x4064000000000000 */
19   /* 0x4066000000000000 */
19   /* 0x4068000000000000 */
20   /* 0x406a000000000000 */
20   /* 0x406c000000000000 */
20   /* 0x406e000000000000 */
20   /* 0x4070000000000000 */
20   /* 0x4072000000000000 */
21   /* 0x4074000000000000 */
21   /* 0x4076000000000000 */
21   /* 0x4078000000000000 */
22   /* 0x407a000000000000 */
22   /* 0x407c000000000000 */
22   /* 0x407e000000000000 */
```

```
23   /* 0x4080000000000000 */
23   /* 0x4082000000000000 */
24   /* 0x4084000000000000 */
25   /* 0x4086000000000000 */
25   /* 0x4088000000000000 */
26   /* 0x408a000000000000 */
26   /* 0x408c000000000000 */
27   /* 0x408e000000000000 */
28   /* 0x4090000000000000 */
28   /* 0x4092000000000000 */
28   /* 0x4094000000000000 */
28   /* 0x4096000000000000 */
28   /* 0x4098000000000000 */
28   /* 0x409a000000000000 */
28   /* 0x409c000000000000 */
28   /* 0x409e000000000000 */
29   /* 0x40a0000000000000 */
29   /* 0x40a2000000000000 */
29   /* 0x40a4000000000000 */
29   /* 0x40a6000000000000 */
30   /* 0x40a8000000000000 */
30   /* 0x40aa000000000000 */
30   /* 0x40ac000000000000 */
30   /* 0x40ae000000000000 */
31   /* 0x40b0000000000000 */
31   /* 0x40b2000000000000 */
32   /* 0x40b4000000000000 */
32   /* 0x40b6000000000000 */
33   /* 0x40b8000000000000 */
33   /* 0x40ba000000000000 */
```

·
·
·
·
·

```
167  /* 0x43d2000000000000 */
167  /* 0x43d4000000000000 */
168  /* 0x43d6000000000000 */
168  /* 0x43d8000000000000 */
169  /* 0x43da000000000000 */
170  /* 0x43dc000000000000 */
170  /* 0x43de000000000000 */
171  /* 0x43e0000000000000 */
172  /* 0x43e2000000000000 */
172  /* 0x43e4000000000000 */
172  /* 0x43e6000000000000 */
172  /* 0x43e8000000000000 */
172  /* 0x43ea000000000000 */
172  /* 0x43ec000000000000 */
172  /* 0x43ee000000000000 */
172  /* 0x43f0000000000000 */
```

```
42⤸ 1e+00,  44⤸ /* 0x3ff0000000000000 */  ⤶40
     2e+00,      /* 0x4000000000000000 */
     3e+00,      /* 0x4008000000000000 */
     4e+00,      /* 0x4010000000000000 */
     5e+00,      /* 0x4014000000000000 */
     6e+00,      /* 0x4018000000000000 */
     7e+00,      /* 0x401c000000000000 */
     8e+00,      /* 0x4020000000000000 */
     9e+00,      /* 0x4022000000000000 */
     1e+01,      /* 0x4024000000000000 */
     2e+01,      /* 0x4034000000000000 */
     3e+01,      /* 0x403e000000000000 */
     4e+01,      /* 0x4044000000000000 */
     5e+01,      /* 0x4049000000000000 */
     6e+01,      /* 0x404e000000000000 */
     7e+01,      /* 0x4051800000000000 */
     8e+01,      /* 0x4054000000000000 */
     9e+01,      /* 0x4056800000000000 */
     1e+02,      /* 0x4059000000000000 */
     2e+02,      /* 0x4069000000000000 */
     3e+02,      /* 0x4072c00000000000 */
     4e+02,      /* 0x4079000000000000 */
     5e+02,      /* 0x407f400000000000 */
     6e+02,      /* 0x4082c00000000000 */
     7e+02,      /* 0x4085e00000000000 */
     8e+02,      /* 0x4089000000000000 */
     9e+02,      /* 0x408c200000000000 */
```

•
•
•
•
•

```
     1e+15,      /* 0x430c6bf526340000 */
     2e+15,      /* 0x431c6bf526340000 */
     3e+15,      /* 0x432550f7dca70000 */
     4e+15,      /* 0x432c6bf526340000 */
     5e+15,      /* 0x4331c37937e08000 */
     6e+15,      /* 0x433550f7dca70000 */
     7e+15,      /* 0x4338de76816d8000 */
     8e+15,      /* 0x433c6bf526340000 */
     9e+15,      /* 0x433ff973cafa8000 */
     1e+16,      /* 0x4341c37937e08000 */
```

*Fig. 5*

SYSTEM AND TABLE-BASED METHOD FOR CONVERTING BINARY FLOATING-POINT NUMBERS TO A DECIMAL REPRESENTATION

BACKGROUND OF THE INVENTION

1. Technical Field

The present invention relates in general to an improved system and method for data processing, and in particular, to a system and method for numeric conversion within a computer. Still more particularly, the present invention relates to a system and table-based method for converting a floating-point number from a binary representation to a decimal representation within a computer.

2. Description of the Prior Art

The conversion of floating-point numbers from a binary to a decimal representation is one of the most commonly utilized routines in computer programs. This is attributed to the fact that numerical values associated with selected real world values are represented in binary form internally within a computer for manipulation while it is typically more pleasing to a human to read those numerical values in a decimal form. However, the conversion from the computer's binary representation to a decimal representation is a very slow process.

The traditional algorithm for converting a binary floating-point number to its decimal representation requires the usage of successive division by 10 to obtain an ASCII string starting from the least significant digit to the most significant digit. This traditional algorithm is described as follows:

```
do{
    temp = binary_number / 10.0
    y = truncate (temp / 10.0);        /* obtain the largest
                                          integer which is not
                                          greater than temp */
    value = binary_number - y * 10.0;  /* value of the least
                                          significant digit */
    next digit = int(value) + '0';     /* convert value into an
                                          integer and calculate the
                                          ascii value of the
                                          corresponding digit */
    binary_number = y;
} while (binary_number > 0);
```

Under the above algorithm, division operations are repeated several times within the do loop. However, division operations are typically very slow. For example, for a RS/6000™ computer manufactured by International Business Machines Corporation, a division operation takes 18 processor cycles while most other instructions would only take 1 cycle. Further, the truncation process for obtaining the largest integer that is smaller than the binary floating-point number is quite computer dependent. But regardless of the type of computer being utilized, the truncation process typically requires more than a few instructions because it usually involves the switching of a processor's rounding mode between a round-to-zero mode and a round-to-nearest mode. Finally, the conversion of a floating-point value into an integer also requires more than a few instructions.

As shown by the steps involved, the conversion of a binary floating-point number to a decimal representation is a very time-consuming process under the traditional algorithm. Consequently, it would be desirable to provide an improved system to perform such conversion within a computer in a more efficient manner.

SUMMARY OF THE INVENTION

In view of the foregoing, it is therefore an object of the present invention to provide an improved system and method for data processing.

It is another object of the present invention to provide an improved system and method for numeric conversion within a computer.

It is yet another object of the present invention to provide an improved system and table-based method for converting binary floating-point numbers to their decimal representations within a computer.

In accordance with a preferred embodiment of the present invention, a computer system is provided which includes a first table and a second table. Both of the tables have several entry locations, and each of these entry locations contains a number. The computer system also has an extraction routine for extracting a first index into the first table from a binary floating-point number, an acquiring routine for obtaining a second index into the second table from the number contained within an entry location of the first table referenced by the first index, and an identifying routine for identifying a selected entry location of the second table. Such identification can be performed either by utilizing the second index or by utilizing a decremented second index when a number contained within an initial entry location of the second table referenced by the second index is greater than the binary floating-point number. In addition, the computer system also includes a display for displaying a most significant digit of a number contained within the selected entry location of the second table. Finally, the computer system includes a subtraction routine for subtracting the number contained within the selected entry location of the second table from the binary floating-point number, and a detection routine for detecting whether the binary floating-point number is equal to zero.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 4 is the first table of numbers of FIG. 3 arranged in accordance with a preferred embodiment of the invention;

FIG. 5 is the second table of numbers of FIG. 3 arranged in accordance with a preferred embodiment of the invention.

DETAILED DESCRIPTION OF PREFERRED EMBODIMENT

The present invention may be implemented in a number of different application software or software libraries to be executed in a variety of computers. The computer may be, for example, a personal computer, a mini-computer, or a mainframe computer. In addition, the computer may be a stand-alone system or part of a network such as a local-area network (LA) or a wide-area network (WAN). For the purpose of illustration, a preferred embodiment of the present invention, as described below, is implemented on the AIX™ operating system version 4.1.3, executing in an RS/6000™ computer, both manufactured by International Business Machines Corporation.

Figure 1:
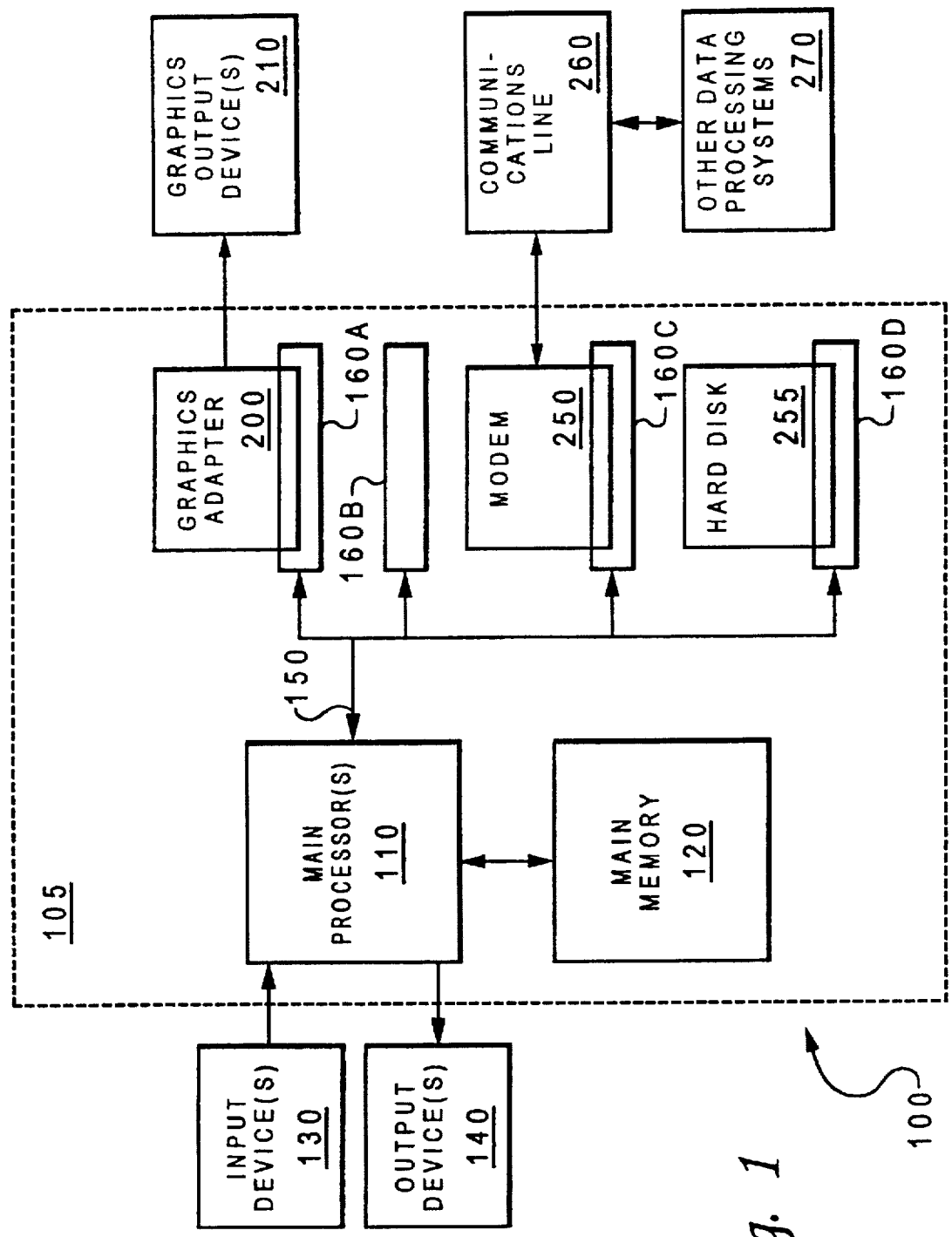
FIG. 1 is a block diagram of a computer which may utilize a preferred embodiment of the present invention.

Referring now to the drawings and in particular to FIG. 1, there is illustrated a block diagram of computer 100 which may utilize a preferred embodiment of the present invention. Computer 100 typically includes main processor(s) 110 coupled to a main memory 120 within processor unit 105, having input device(s) 130 and output device(s) 140 attached thereto. Main processor(s) 110 may include a single processor or multiple processors. Input device(s) 130 may include a keyboard, a keypad, or other types of input devices. Output device(s) 140 may include a display monitor, a printer, or other types of output devices. A number of peripheral devices may be connected to adaptor slots 160A, 160B, 160C and 160D in order to provide communications with main processor 110 via internal bus 150. As shown in FIG. 1, graphics adaptor 200, modem 250, and hard disk 255 are connected to adaptor slots 160A, 160C and 160D, respectively, while adaptor slot 160B remains open. Graphics adaptor 200 receives instructions regarding graphics from main processor 110 via internal bus 150, thereby rendering the desired graphics output from main processor 110 to graphics output device(s) 210. Modem 250 may communicate with other data processing systems 270 across communications line 260. Typically information from hard disk(s) 255 is transferred to main memory 120 to be utilized by main processor(s) 110. However, a different type of memory known as a cache memory (not shown) may also be present, normally between main processor(s) 110 and main memory 120, for enhancing the speed of memory access by main processor(s) 110.

Figure 2:
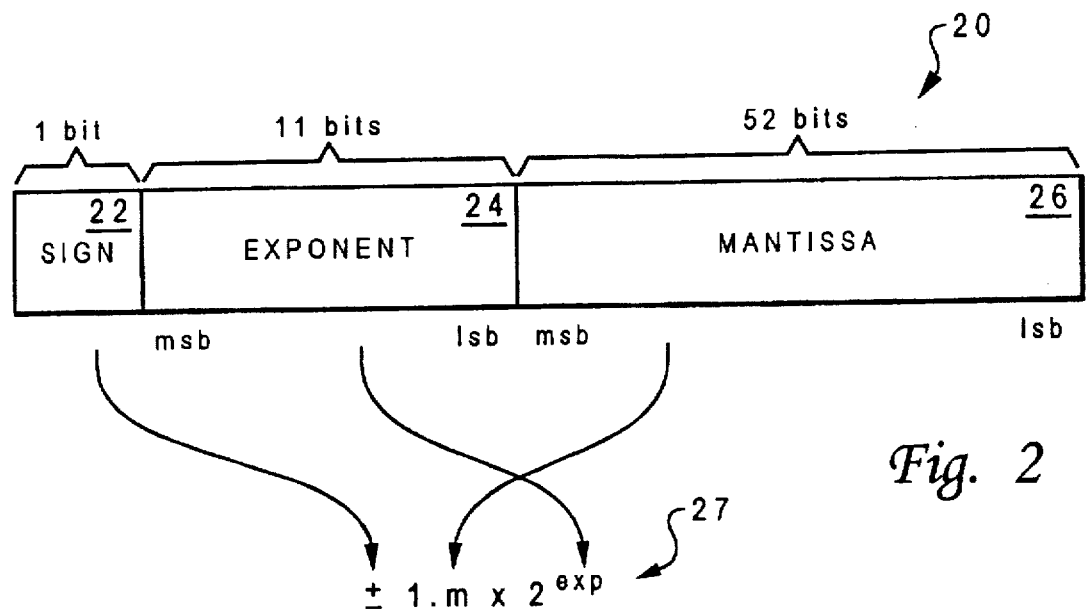
FIG. 2 is a double-precision format for a binary floating-point number, according to the Institute of Electrical and Electronics Engineers standard.

With reference now to FIG. 2, there is illustrated a double-precision format for a binary floating-point number, according to a standard promulgated by the Institute of Electrical and Electronics Engineers (IEEE). Under the IEEE standard, double-precision format 20 consists of three fields—a sign-bit field 22, an exponent field 24 and a mantissa field 26. As the name implies, sign-bit field 22 contains one bit indicating whether the corresponding binary floating-point number is a positive number (denoted by a "0") or a negative number (denoted by a "1"). Exponent field 24 contains a binary exponent (the power of 2) of the corresponding binary floating-point number, and is 11 bits wide. In addition, according to the IEEE standard, exponent field 24 is biased by $3FF_{hex}$. Finally, mantissa field 26 contains a mantissa of the corresponding binary floating-point number, and is 52 bits wide.

Accordingly, any binary floating-point number 27 can be represented under double-precision format 20 having a sign-bit field 22, an exponent field 24 and a mantissa field 26, as shown in FIG. 2. A digit "1" before the decimal point is implied under double-precision format 20. The binary floating-point number representations under the IEEE standard are described in more detail in *IEEE Standard for Binary Floating-Point Arithmetic*, ANSI/IEEE standard 754–1985, and is incorporated herein by reference.

Figure 3:
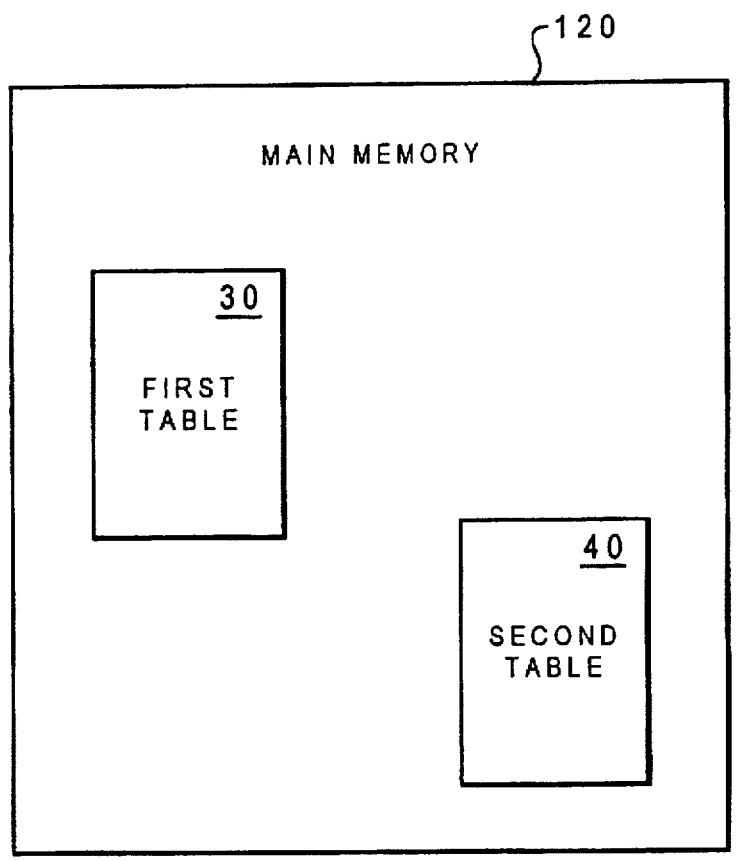
FIG. 3 is a first table of numbers and a second table of numbers for a table-based computer system in accordance with a preferred embodiment of the invention.

Referring now to FIG. 3, there is depicted a first table of numbers and a second table of numbers for a table-based computer system in accordance with a preferred embodiment of the invention. As shown, table 30 are table 40 is preferably stored in main memory 120 of computer 100 of FIG. 1 during operation.

With reference now to FIG. 4, there is illustrated table 30 arranged in accordance with a preferred embodiment of the invention. As shown, table 30 has two columns, column 32 and column 34. Each number in column 32 of table 30 is an integer for indexing into a second table, as will be described below. Each number in column 34 is an internal representation of the corresponding number in column 32, according to the IEEE double-precision format in FIG. 2. The numbers in column 34, in its hexadecimal format, are shown alongside the numbers in column 32 mainly for reference purpose. A close examination of the numbers in column 34 will reveal that each number is an increment of 2 0000 0000 $0000_{hex}$ to a number in a previous row, starting with the first row at 3FF0 0000 0000 $0000_{hex}$. The first row is also the $0^{th}$ entry. The resolution of 2 0000 0000 $0000_{hex}$ is sufficient for determining the most significant decimal digit of a binary floating-point number under the IEEE double-precision format in FIG. 2. Further, the size of table 30 is dependent on the maximum number of decimal digits desired. A total of 512 entries is sufficient to generate 16 decimal digits which is also the maximum precision the IEEE double-precision format can represent.

Referring now to FIG. 5, there is depicted table 40 arranged in accordance with a preferred embodiment of the invention. As shown, table 40 has two columns, column 42 and column 44. Each number in column 42 of table 40 is an integer having exactly one non-zero digit and may be followed by some trailing zeros. As in column 34 of table 30, each number in column 44 is an internal representation of the corresponding number in column 42, according to the IEEE double-precision format in FIG. 2. Similarly, the numbers in column 44, in its hexadecimal format, are shown alongside the numbers in column 42 mainly for reference purpose. Also similar to column 32 of table 30 in FIG. 3, each number in column 42 of table 40 is arranged according to a preferred order. A close examination of the integers in column 42 will reveal that each number is a step increment of a number in a previous row, according to the magnitude of the number, starting with the first row at $1 \times 10^0$. The first row is again the $0^{th}$ entry. For example, from $1 \times 10^0$ to $1 \times 10^1$, each step increment is 1; from $1 \times 10^1$ to $1 \times 10^2$, each step increment is 10; from $1 \times 10^2$ to $1 \times 10^3$, each step increment is 100; etc. The resolution, as indicated by the step increment, of table 40 may vary depending on the application; however, the step increment as described above is considered to be the best mode. Further, the size of table 40 is dependent on the maximum number of decimal digits desired. Because the IEEE double-precision format can only represent a maximum of 16-digit precision of a decimal equivalent, a maximum of $1 \times 10^{16}$ should suffice.

Figure 6:
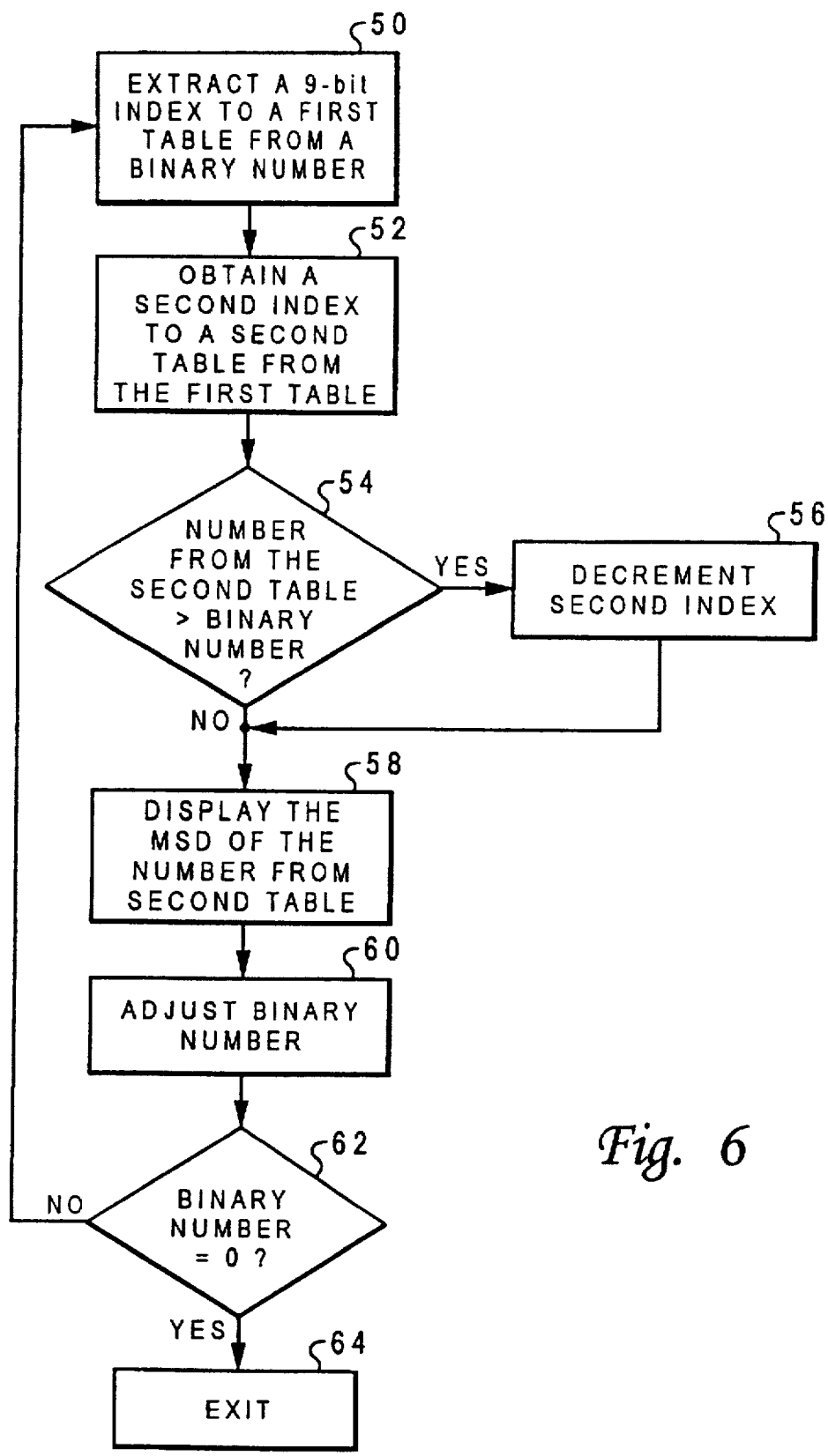
FIG. 6 is a high-level flow diagram of a table-based method for converting a binary floating-point number to a decimal representation in accordance with a preferred embodiment of the invention.

With reference now to FIG. 6, there is illustrated a high-level flow diagram of a table-based method for converting a binary floating-point number to a decimal representation, in accordance with a preferred embodiment of the invention. Starting at block 50, a 9-bit index is extracted from the binary floating-point number. The extraction is performed by first subtracting 3FF0 0000 0000 $0000_{hex}$ from the binary floating-point number and then right shifts 49 bits to obtain a 9-bit index. This 9-bit index is utilized as a positional pointer into an entry of a first table (table 30 of FIG. 3) for obtaining a second index into a second table (table 40 of FIG. 4), as depicted in block 52. The second index is then utilized as a positional pointer to an entry into the second table. The number in the entry of the second table at which the second index is pointing is then compared with the binary floating-point number to determine whether or not the number in the entry of the second table is greater than the binary floating-point number, as illustrated in block 54. If the number in the entry of the second table is greater than the binary floating-point number, then the second index (or positional pointer to the second table) is decremented, as shown in block 56. Now the second index is pointing at an entry with a number indicating the most significant digit of the binary floating-point number. Otherwise, if the number in the entry of the second table is not greater than the binary floating-point number, then the second index is already pointing at an entry with a number indicating the most significant digit of the binary floating-point number.

At this point, the most significant digit of the number in the entry can be displayed, as depicted in block 58. The binary floating-point number is then adjusted by subtracting the number in the entry from the second table, as shown in block 60. Subsequently, a determination is made as to whether the binary floating-point number is equal to zero at this point, as illustrated in block 62. If the binary floating-point number is not equal to zero, then the process returns back to the extraction step in block 50; otherwise, the process exits, as shown in block 64.

The following is an example illustrating the table-based method for converting a binary floating-point number to a decimal representation, in accordance with a preferred embodiment of the invention. A binary floating-point number representing in 4085 3000 0000 0000$_{hex}$ (678 in decimal) will be utilized for such illustration. First, a 9-bit index is extracted from the binary floating-point number by performing the following operation:

(4085 3000 0000 0000$_{hex}$-3FF0 0000 0000 0000$_{hex}$)>>49

The result from such operation for 4085 3000 0000 0000$_{hex}$ is 4A$_{hex}$, which is 74 in decimal. Thus, 74 is utilized as an index for indexing into a first table (table 30 of FIG. 3), and the number in the 74$^{th}$ entry of the first table is found to be "24." Next, 24 is utilized as a second index for indexing into a second table (table 40 of FIG. 4), and the number in the 24$^{th}$ entry of the second table is found to be "7e+2" (or 700). But, at this point, it is not conclusive as to whether the binary floating-point number is greater than, equal to, or less than 700. Hence, a determination is made as to whether or not the number from the second table (700) is greater than the binary floating-point number (678). Because 678 is less than 700, therefore, the second index to the second table should be decremented. Now the second index is pointing at the 23$^{rd}$ entry of the second table. The value in the 23$^{rd}$ entry is "6e+2" (or 600) and hence the digit "6" is displayed as the most significant digit in a hundreds position. Then, 600 is subtracted from the binary floating-point number, leaving "78" as the difference. Because 78 is not equal to zero, the process returns to the extraction step.

Now the binary floating-point number is 78 in decimal or in 4053 8000 0000 0000$_{hex}$. A 9-bit index is extracted from the binary floating-point number by performing the following operation:

(4053 8000 0000 0000$_{hex}$-3FF0 0000 0000 0000$_{hex}$)>>49

The result from such operation for 4053 8000 0000 0000$_{hex}$ is 31$_{hex}$, which is 49 in decimal. Thus, 49 is utilized as an index for indexing into the first table, and the number in the 49$^{th}$ entry of the first table is found to be "16." Next, 16 is utilized as a second index for indexing into the second table, and the number in the 16$^{th}$ entry of the second table is found to be "8e+1" (or 80). A determination is then made as to whether or not the number from the second table (80) is greater than the binary floating-point number (78). Because 78 is less than 80, therefore, the second index to the second table should be decremented. Now the second index is pointing at the 15$^{th}$ entry of the second table. The number in the 15$^{th}$ entry is "7e+1" (or 70) and hence the digit "7" is displayed as the most significant digit in a tens position. Then, 70 is subtracted from the binary floating-point number, leaving "8" as the difference. Because 8 is not equal to zero, the process returns to the extraction step.

Now the binary floating-point number is 8 in decimal or in 4020 0000 0000 0000$_{hex}$. A 9-bit index is extracted from the binary floating-point number by performing the following operation:

(4020 0000 0000 0000$_{hex}$-3FF0 0000 0000 0000$_{hex}$)>>49

The result from such operation for 4020 0000 0000 0000$_{hex}$ is 18$_{hex}$, which is 24 in decimal. Thus, 24 is utilized as an index for indexing into the first table, and the number in the 24$^{th}$ entry of the first table is found to be "8." Next, 8 is utilized as a second index for indexing into the second table, and the number in the 8$^{th}$ entry of the second table is found to be "9e+0" (or 9). A determination is then made as to whether or not the number from the second table (9) is greater than the binary floating-point number (8). Because 8 is less than 9, therefore, the second index to the second table should be decremented. Now the second index is pointing at the 7$^{th}$ entry of the second table. The number in the 7$^{th}$ entry is "8e+0" (or 8), and hence, the digit "8" is displayed as the most significant digit in a ones position. Then, 8 is subtracted from the binary floating-point number, leaving "0" as the difference. At this point, the binary floating-number is equal to 0, the process exits. This concludes the illustration.

As has been described, the present invention provides an improved system for converting a binary floating-point number to a decimal representation within a computer. Although only the IEEE standard binary floating-point numbers are utilized to illustrate this invention, the system as described is also applicable to binary floating-point numbers under other formats. Because no multiplication, division, or switching of the rounding modes is required and most of the operations are performed in integer, this invention provides a tremendous benefit to a computer with a slow or no floating-point processor. This invention can be applied to numbers of any size as long as the subtraction and the comparison are executed in their proper precision, because performing such operations in a precision that extends beyond the working precision of the processor is very slow. In sum, because the present invention only requires subtraction and comparison operations as compared to the successive multiplications and divisions as required by the traditional algorithm, the performance gain for binary-to-decimal conversion is significant.

While the invention has been particularly shown and described with reference to a preferred embodiment, it will be understood by those skilled in the art that various changes in form and detail may be made therein without departing from the spirit and scope of the invention.

What is claimed is:

1. A table-based computer system capable of converting a binary floating-point number to a decimal representation, said table-based computer system comprising:

a first table having a plurality of entry locations, wherein each of said plurality of entry locations contains a number;

a second table having a plurality of entry locations, wherein each of said plurality of entry locations contains a number;

an extraction means for extracting a first index into said first table from said binary floating-point number;

an acquiring means for obtaining a second index into said second table from a number contained within an entry location in said first table referenced by said first index;

an identifying means for identifying a selected entry location of said second table by utilizing said second index or by utilizing a decremented second index only if a number contained within an initial entry location of said second table referenced by said second index is greater than said binary floating-point number;

a display means for displaying a most significant digit of a number contained within said selected entry location of said second table;

a subtraction means for subtracting said number contained within said selected entry location of said second table from said binary floating-point number;

a detecting means for checking whether said binary floating-point number is equal to zero.

2. The table-based computer system capable of converting a binary floating-point number to a decimal representation according to claim 1, wherein said extraction means for extracting includes means for subtracting 3FF0 0000 0000 0000$_{hex}$ from said binary floating-point number to obtain a difference and means for right shifting 49 bits of said difference.

3. The table-based computer system capable of converting a binary floating-point number to a decimal representation according to claim 1, wherein said display means further displays said number contained within said selected entry location of said second table in a position equivalent to its magnitude.

4. The table-based computer system capable of converting a binary floating-point number to a decimal representation according to claim 1, wherein said first table further includes a plurality of entry locations with numbers in an increment of 2 0000 0000 0000$_{hex}$.

5. A table-based computer program product residing on a table-based computer-usable medium for converting a binary floating-point number to a decimal representation within a table-based computer, said table-based computer product comprising:

program code means for providing a first table having a plurality of entry locations, wherein each of said plurality of entry locations contains a number;

program code means for providing a second table having a plurality of entry locations, wherein each of said plurality of entry locations contains a number;

program code means for extracting a first index into said first table from said binary floating-point number;

program code means for obtaining a second index into said second table from a number contained within an entry location in said first table referenced by said first index;

program code means for identifying a selected entry location of said second table by utilizing said second index or by utilizing a decremented second index only if a number contained within an initial entry location of said second table referenced by said second index is greater than said binary floating-point number;

program code means for displaying a most significant digit of a number contained within said selected entry location of said second table;

program code means for subtracting said number contained within said selected entry location of said second table from said binary floating-point number;

program code means for returning to said extracting step if said binary floating-point number is not equal to zero.

6. The table-based computer program product residing on a table-based computer-usable medium for converting a binary floating-point number to a decimal representation within a table-based computer according to claim 5, wherein said program code means for extracting includes program code means for subtracting 3FF0 0000 0000 0000$_{hex}$ from said binary floating-point number to obtain a difference and program code means for right shifting 49 bits of said difference.

7. The table-based computer program product residing on a table-based computer-usable medium for converting a binary floating-point number to a decimal representation within a table-based computer according to claim 5, wherein said program code means for displaying includes program code means for displaying said number contained within said selected entry location of said second table in a position equivalent to its magnitude.

8. The table-based computer program product residing on a table-based computer-usable medium for converting a binary floating-point number to a decimal representation within a table-based computer according to claim 5, wherein said program code means for providing a first table having a plurality of entry locations with numbers further includes program code means for providing a first table having a plurality of entry locations with numbers in an increment of 2 0000 0000 0000$_{hex}$.

9. A table-based method for converting a binary floating-point number to a decimal representation within a table-based computer, said method comprising the steps of:

providing a first table having a plurality of entry locations, wherein each of said plurality of entry locations contains a number;

providing a second table having a plurality of entry locations, wherein each of said plurality of entry locations contains a number;

extracting a first index into said first table from said binary floating-point number;

obtaining a second index into said second table from a number contained within an entry location in said first table referenced by said first index;

identifying a selected entry location of said second table by utilizing said second index or by utilizing a decremented second index only if a number contained within an initial entry location of said second table referenced by said second index is greater than said binary floating-point number;

displaying a most significant digit of a number contained within said selected entry location of said second table;

subtracting said number contained within said selected entry location of said second table from said binary floating-point number;

returning to said extracting step if said binary floating-point number is not equal to zero.

10. The table-based method for converting a binary floating-point number to a decimal representation within a computer according to claim 9, wherein said step of extracting includes the step of subtracting 3FF0 0000 0000 0000$_{hex}$ from said binary floating-point number to obtain a difference and the step of right shifting 49 bits of said difference.

11. The table-based method for converting a binary floating-point number to a decimal representation within a computer according to claim 9, wherein said step of displaying includes the step of displaying said number contained within said selected entry location of said second table in a position equivalent to its magnitude.

12. The table-based method for converting a binary floating-point number to a decimal representation within a computer according to claim 9, wherein said step of providing a first table having a plurality of entry locations with numbers further includes the step of providing a first table having a plurality of entry locations with numbers in an increment of 2 0000 0000 0000$_{hex}$.

\* \* \* \* \*